(12) United States Patent
Ando et al.

(10) Patent No.: US 7,803,433 B2
(45) Date of Patent: Sep. 28, 2010

(54) AMORPHOUS CARBON FILM FORMING METHOD AND DEVICE

(75) Inventors: Junji Ando, Aichi (JP); Naoyuki Sakai, Aichi (JP); Toshiyuki Saito, Aichi (JP); Kazuyuki Nakanishi, Aichi (JP); Hiroyuki Mori, Aichi (JP); Hideo Tachikawa, Aichi (JP); Kyouji Itou, Aichi (JP); Mikio Fujioka, Aichi (JP); Yoshiyuki Funaki, Tokyo (JP)

(73) Assignee: JTEKT Corporation, Osaka (JP)

( * ) Notice: Subject to any disclaimer, the term of this patent is extended or adjusted under 35 U.S.C. 154(b) by 1182 days.

(21) Appl. No.: 10/544,674

(22) PCT Filed: Feb. 12, 2004

(86) PCT No.: PCT/JP2004/001482

§ 371 (c)(1),
(2), (4) Date: Mar. 28, 2006

(87) PCT Pub. No.: WO2004/072322

PCT Pub. Date: Aug. 26, 2004

(65) Prior Publication Data

US 2008/0317976 A1   Dec. 25, 2008

(30) Foreign Application Priority Data

Feb. 12, 2003 (JP) .............................. 2003-033859

(51) Int. Cl.
  H05H 1/24 (2006.01)
  H01F 41/00 (2006.01)
  G21H 5/00 (2006.01)
  G21H 1/00 (2006.01)
  B01J 19/08 (2006.01)

(52) U.S. Cl. .................. 427/577; 427/569; 427/457

(58) Field of Classification Search .... 427/248.1–255.7
See application file for complete search history.

(56) References Cited

U.S. PATENT DOCUMENTS 5,052,339 A * 10/1991 Vakerlis et al. ........... 118/723 E (Continued)

FOREIGN PATENT DOCUMENTS

EP   0 794 014   9/1997

(Continued)

OTHER PUBLICATIONS

U.S. Appl. No. 11/369,861, filed Mar. 8, 2006, Saito, et al.

(Continued)

*Primary Examiner*—Timothy H Meeks
*Assistant Examiner*—Michael G Miller
(74) *Attorney, Agent, or Firm*—Oblon, Spivak, McClelland, Maier & Neustadt, L.L.P.

(57) ABSTRACT

An amorphous carbon film forming apparatus according to the present invention is characterized by being provided with a film forming furnace 11; plural workpiece fixtures 23 for supporting plural plate-like workpieces 22 in a state that the same are piled up vertically in parallel with the interval between facing surfaces of two vertically adjoining of the plate-like workpieces 22 being in a range of 2 to 30 millimeters, the plural workpiece fixtures 23 being arranged within the film forming furnace 11 at a regular angular interval on a circle and being connected to a negative electrode; nozzles 31, 32 provided for supplying a processing gas and including at least one nozzle arranged at a center of the circle on which the plural workpiece fixtures 23 are arranged and plural nozzles arranged at a regular angular interval on another circle which surrounds the workpieces fixtures 23 radially outside thereof; and a plasma power supply connected to at least the workpiece fixtures 23. By controlling the supply gas pressure to be in a range of 13 to 1,330 Pa and a sheath width to be made in a range of 2 to 30 mm, the discharge is kept stably. As a consequence, it can be realized to form amorphous carbon films efficiently at a low cost.

13 Claims, 9 Drawing Sheets

U.S. PATENT DOCUMENTS 5,611,862 A * 3/1997 Lee et al. .................. 118/723 E
2003/0106759 A1 * 6/2003 Sakai et al. ................... 192/35

FOREIGN PATENT DOCUMENTS

| JP | 64-80023 | 3/1989 |
| JP | 2-80579 | 3/1990 |
| JP | 6-25874 | 2/1994 |
| JP | 6-256957 | 9/1994 |
| JP | 2001-524391 | 12/2001 |

OTHER PUBLICATIONS

U.S. Appl. No. 12/089,214, filed Apr. 4, 2008, Ando, et al.
Collisional plasma sheath model, T.E. Sheridan and J. Goree Department of physics and Astronomy, The University of Iowa, Iowa City, Iowa 52242 (Received Apr. 25, 1991; accepted May 30, 1991) pp. 2796-2804.

* cited by examiner

AMORPHOUS CARBON FILM FORMING METHOD AND DEVICE

TECHNOLOGICAL FIELD

The present invention relates to a forming method and apparatus for amorphous carbon films by a plasma CVD Method.

BACKGROUND ART

Being almost limitless and harmless, carbon is a very excellent material in terms of resources problem and environmental problem. The carbon material is diverse in the coupling configuration among atoms and is known to have various crystal structures such as, for example, diamond, diamond-like carbon, graphite, fullerene, carbon nanotube, and the like. Of these materials, diamond-like carbon which is an amorphous carbon film is attracted as a functional material which is excellent in mechanical properties such as, for example, wear resistance, solid lubrication and the like and which further has conductivity, visual ray/infrared ray transmittance, low permittivity, anti-oxygen barrier and the like.

Diamond-like carbon (DLC) is amorphous in crystal structure and is usually obtained on a surface of a substrate with amorphous carbon deposited thereon by a chemical vapor deposition (CVD) method. As the chemical vapor deposition (CVD) method, a plasma CVD method of parallel flat surface type is general which utilizes glow discharge generated by applying high-frequency electric power between two facing electrodes, as disclosed in Japanese unexamined, published patent application No. 6-256957. Specifically, a high-frequency electric power is applied between a high-frequency power supply electrode with a substrate arranged and an earthing electrode facing in parallel with the high-frequency power supply electrode, whereby the glow discharge is generated therebetween. By utilizing the glow discharge, a material gas (methane, ethylene or the like) is resolved to deposit a DLC thin film on the substrate.

However, where it is tried to form the DLC thin films all together on plural substrates in the aforementioned method, the plural substrates have to be arranged to be juxtaposed toward the high-frequency power supply electrode, and this needs an electrode of a large area corresponding to the total area of the substrates. Further, forming a film on a large area is technologically difficult, wherein the film thickness and the film composition of the DLC thin film are liable to be uneven on a substrate-by-substrate basis.

Also, in a PVD apparatus of another form for forming a film on a surface of a cylindrical substrate, the substrate has to be revolved in order to form the film over the whole surface of the cylindrical substrate, so that the PVD apparatus would become a high cost for a rotary mechanism provided therefor. Further, the rotary mechanism for revolving the substrate may make a cause of a trouble in the apparatus. In addition, the revolution of the substrate may be performed with the axis of the revolution being off-centered, in which case it is unable to obtain a thin film which is even in film thickness, composition and the like.

The present invention is made in order to solve the foregoing problems, and an object of the present invention is to provide a technology capable of forming amorphous carbon films efficiently at a low cost.

DISCLOSURE OF THE INVENTION

An amorphous carbon film forming method in the first invention is provided for forming amorphous carbon films on surfaces of conductive plate-like workpieces by a plasma CVD method and is characterized in that plural plate-like workpieces are arranged on a workpiece fixture, which is arranged in a film forming furnace and is connected to a negative electrode, in a state that they are piled up in parallel in the thickness direction of the plate-like workpiece, and that the pressure of a processing gas and a plasma power supply are controlled so that a sheath width becomes equal to or less than the interval between facing surfaces of two adjoining plate-like workpieces.

According to the first invention, a stable glow discharge can be obtained for each of the plate-like workpieces by making the sheath width equal to or less than the interval between the facing surfaces of two adjoining plate-like workpieces. Further, since the plate-like workpieces are arranged to be piled up in the thickness direction, the film forming area can be increased greatly, so that an efficient film forming can be realized.

The amorphous carbon film forming method in the second invention is characterized in that in the first invention, the pressure of the processing gas is set to be in a range of 13 to 1,330 Pa (pascal), and that the interval between the facing surfaces of two adjoining plate-like workpieces is in a range of 2 to 30 millimeters.

According to the second invention, a stable glow discharge can be obtained by setting the pressure of the processing gas and the interval between the facing surfaces of the plate-like workpieces respectively to be in the aforementioned ranges.

The amorphous carbon film forming method in the third invention is characterized in that in the first or second invention, the pressure of the processing gas is in a range of 66.5 to 1,064 Pa.

According to the third invention, a more stable glow discharge can be obtained by setting the pressure of the processing gas to be in the aforementioned range.

The amorphous carbon film forming method in the fourth invention is characterized in that in the first or second invention, the pressure of the processing gas is in a range of 266 to 798 Pa.

According to the fourth invention, a much more stable glow discharge can be obtained by setting the pressure of the processing gas to be in the aforementioned range.

The amorphous carbon film forming method in the fifth invention is characterized in that in the first or second invention, the interval between the facing surfaces of two adjoining plate-like workpieces is in a range of 3 to 20 mm.

According to the fifth invention, a more stable glow discharge can be obtained by setting the interval between the facing surfaces of two adjoining plate-like workpieces to be in the aforementioned range.

The amorphous carbon film forming method in the sixth invention is characterized in that in the first or second invention, the interval between the facing surfaces of two adjoining plate-like workpieces is in a range of 5 to 15 mm.

According to the sixth invention, a much more stable glow discharge can be obtained by setting the interval between the facing surfaces of two adjoining plate-like workpieces to be in the aforementioned range.

The amorphous carbon film forming method in the seventh invention is characterized in that in the first or second invention, the plate-like workpieces take a disc shape.

According to the seventh invention, it can be realized to efficiently manufacture the plate-like workpieces of a disc shape each having an amorphous carbon film formed thereon stably.

The amorphous carbon film forming method in the eighth invention is characterized in that in the first or second invention, the plate-like workpieces are clutch plates.

According to the eighth invention, it can be realized to efficiently manufacture the clutch plates each having an amorphous carbon film formed thereon stably.

The amorphous carbon film forming method in the ninth invention is characterized in that in the first or second invention, the processing gas is a mixed gas consisting of one or more kinds selected from organometallic bearing gases and halogen compound including at least Si and also consisting of one or more kinds selected from hydrocarbon gases.

According to the ninth invention, an amorphous carbon film which is excellent in film quality as being less in the variation of film thickness and film composition can be obtained by using the aforementioned processing gas.

The amorphous carbon film forming method in the tenth invention is characterized in that in the ninth invention, the organometallic bearing gases are tetramethylsilane and silane.

According to the tenth invention, an amorphous carbon film which is excellent in film quality as being less in the variation of film thickness and film composition can be obtained by using the aforementioned processing gas.

The amorphous carbon film forming method in the eleventh invention is characterized in that in the ninth invention, the halogen compound is silicon tetrachloride.

According to the eleventh invention, an amorphous carbon film which is excellent in film quality as being less in the variation of film thickness and film composition can be obtained by using the aforementioned processing gas.

The amorphous carbon film forming method in the twelfth invention is characterized in that in the ninth invention, the hydrocarbon gases are methane, ethylene, acetylene and benzene.

According to the twelfth invention, an amorphous carbon film which is excellent in film quality as being less in the variation of film thickness and film composition can be obtained by using the aforementioned processing gas.

The amorphous carbon film forming method in the thirteenth invention is characterized in that in the first or second invention, the film forming furnace has a cylindrical furnace chamber, in which workpiece fixtures are arranged at a regular angular interval on a circle having a center coaxial with the furnace chamber, in which plural tubular nozzles for supplying the processing gas are arranged at a regular angular interval on another circle which surrounds the workpiece fixtures with a center thereof coaxial with the furnace chamber, and in which at least one tubular nozzle is further arranged at the center of the furnace chamber to extend vertically in parallel with the plural tubular nozzles.

According to the thirteenth invention, the unevenness in film distribution and film composition can be suppressed, so that the amorphous carbon film can be evenly formed on all of the plate-like workpieces.

An amorphous carbon film forming apparatus in the fourteenth invention is provided for forming amorphous carbon films on surfaces of conductive plate-like workpieces by a plasma CVD method and is characterized by being provided with a film forming furnace; plural workpiece fixtures capable of supporting plural plate-like workpieces to be piled up vertically in parallel relation and arranged within a furnace chamber of the film forming furnace at a regular angular interval on a circle with a center coaxial with the furnace chamber, the plural workpiece fixtures being connected to a negative electrode; nozzles provided for supplying a processing gas and including at least one nozzle arranged at a center of the circle on which the plural workpiece fixtures are arranged and plural nozzles arranged at a regular angular interval on another circle which surrounds the workpieces fixtures radially outside thereof; and a plasma power supply connected to at least the workpiece fixtures.

According to the fourteenth invention, since the plural plate-like workpieces are held on the workpiece fixtures to be piled up in the vertical direction, the plural workpieces of a much more number than those in the prior art apparatus can be processed through one film forming processing. Thus, the film forming area can be increased greatly, so that efficient film forming can be realized. Further, since the arrangements of the workpiece fixtures and the nozzles for supplying the processing gas are made as aforementioned, the distribution of the processing gas becomes good. Thus, the unevenness in film distribution and film composition can be suppressed, so that the amorphous carbon film can be evenly formed on all of the plate-like workpieces. Accordingly, it can be realized to obtain an amorphous carbon film which is excellent in film quality as being less in the variation of film thickness and film composition. Furthermore, the film forming apparatus of the aforementioned construction does not need any rotary mechanism because it is unnecessary to rotate the workpieces. Therefore, the film forming apparatus is simplified in construction and low in cost. In addition, since the arrangements of the workpiece fixtures and the nozzles for supplying the processing gas are made as aforementioned, the distribution of the processing gas becomes good, so that it can be realized to obtain an amorphous carbon film which is excellent in film quality as being less in the variation of film thickness and film composition.

The amorphous carbon film forming apparatus in the fifteenth invention is characterized in that in the fourteenth invention, the interval between the facing surfaces of two plate-like workpieces adjoining vertically is in a range of 2 to 30 mm.

According to the fifteenth invention, a stable glow discharge can be obtained for each of the plate-like workpieces by setting the interval between the facing surfaces of the plate-like workpieces to be in the aforementioned range.

BRIEF DESCRIPTION OF THE DRAWINGS

FIG. 5(I) is an explanatory view of a workpiece fixture for an amorphous carbon film forming apparatus in a fifth embodiment.

PREFERRED EMBODIMENTS TO PRACTICE THE INVENTION

Figure 1:
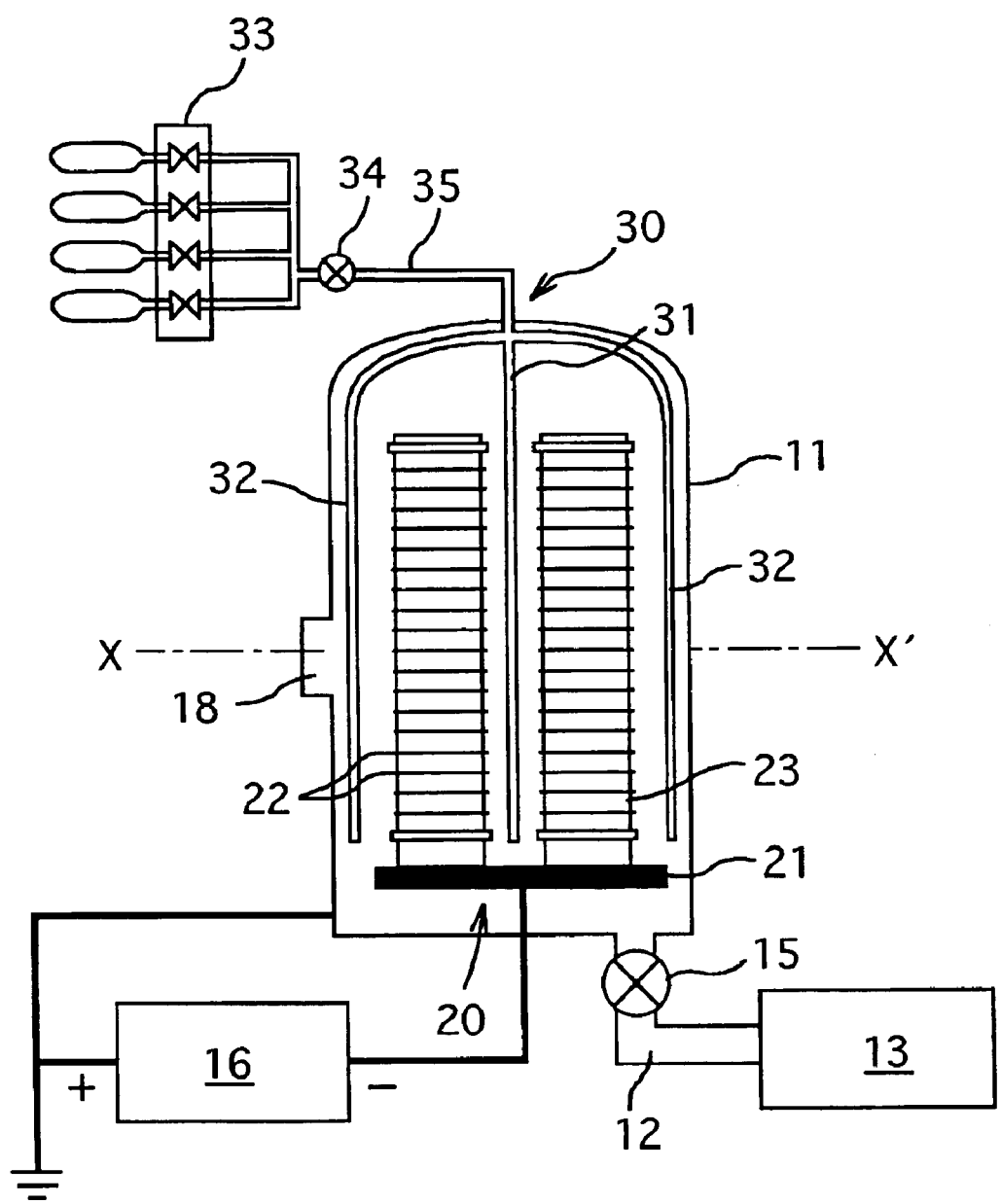
FIG. 1 is an explanatory view showing the schematic construction of an amorphous carbon film forming apparatus.

Hereafter, the embodiments according to the present invention will be described.

[Forming Method for Amorphous Carbon Films]

The forming method for amorphous carbon films according to the present invention is a method of forming amorphous carbon films on surfaces of conductive plate-like workpieces by a plasma CVD method.

In a direct-current plasma CVD method, the application of an electric power between two electrodes causes a glow discharge to occur. By utilizing the glow discharge, a processing gas led between the electrodes is resolved to deposit a thin film on the electrode (plate-like workpiece) on the minus voltage side. The processing gas is desirable to be a mixed gas consisting of a dilute gas and a material gas. The dilute gas consists of at least one kind selected from hydrogen, argon and the like. The material gas consists of at least any one kind selected from hydrocarbon gases such as methane, ethylene, acetylene, benzene and the like and also consists of at least any one kind selected from Si bearing gases such as tetramethylsilane (TMS: $Si(CH_3)_4$), silane, $SiCl_4$ and the like.

The material of the plate-like workpiece does not have any particular limitation therefor as long as it is conductive. The plate-like workpiece does not have any particular limitation also in shape, may take the shape of flat plate, disc or ring and may be a clutch plate used as parts for automotive or the like. The thickness of the plate-like workpiece may be in a range of 0.4 to 4 mm (millimeters) and more favorably in a range of 0.7 to 1 mm though it does not affect a sheath width.

The plate-like workpieces are arranged in a film forming furnace and are fixed by a workpiece fixture connected electrically to a minus electrode. The plate-like workpieces being conductive are fixed with their parts being in touch with the workpiece fixture connected to the minus electrode.

The sheath width is set to be equal to or less than the interval (workpiece interval) between facing surfaces of two adjoining plate-like workpieces. Where the sheath width is equal to or less than the workpiece interval, the glow discharge takes place evenly within the sheath width along external surfaces of the workpiece fixture and each plate-like workpiece, whereby amorphous carbon films can be formed on the both surfaces of each plate-like workpiece. Where the sheath width is greater than the workpiece interval, the glow discharge becomes stronger and unstable locally during the film forming, whereby the film forming cannot be done favorably.

Herein, a term "sheath" generally means the area which covers from the cathode surface to the negative glow and in which the radiation is weak. At the sheath, sudden voltage drop takes place, whereby positive ions are accelerated toward the cathode to come into collision with the same. Electrons released upon the collision are accelerated by the voltage gradient at the sheath and enter into the negative grow area to ionize gas molecules. The reason why the radiation at the sheath is weak is because the electrons cannot excite the gas molecules until they are accelerated to excitation energy for gas molecules. That is, the "sheath width" referred to herein means the width of the area which covers from the plate-like workpiece and the workpiece fixture to the negative grow and in which the radiation is weak.

It is preferable that plural plate-like workpieces are arranged to be piled up in the thickness direction thereof with the interval between facing surfaces of two parallel adjoining plate-like workpieces being in a range of 2 to 30 mm. Where the interval of the plate-like workpieces is less than 2 mm, the grow discharge becomes unstable, whereby the film forming cannot be done favorably. On the other hand, where the interval is greater than 30 mm, the number of the plate-like workpieces which can be fixed by the workpiece fixture decreases to make the mass processing impossible though there can be obtained a stable glow discharge. The interval between two plate-like workpieces is more favorably in a range of 3 to 20 mm and is much more favorably in a ranger of 5 to 15 mm.

Figure 7:
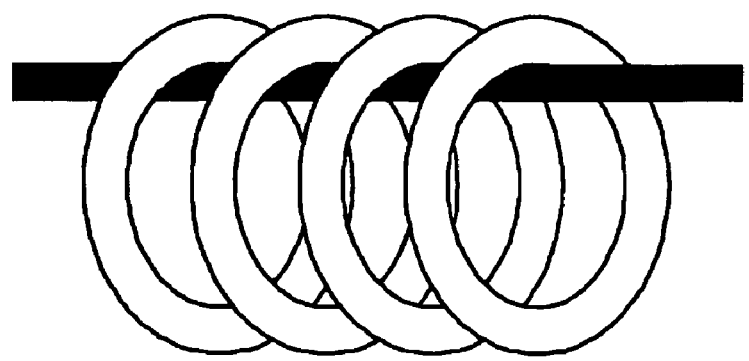
FIG. 7 is an illustration of fixing the plate-like workpieces on a workpiece fixture in a horizontal direction.

The workpiece fixture is not limited to any particular shape as long as it is able to touch with at least a part of each of plural plate-like workpieces as well as to allow the plural plate-like workpieces to be parallel arranged in a pile in the thickness direction thereof. Accordingly, the workpiece fixture may take any of a type that fixes the plate-like workpieces in parallel vertically in the film forming furnace and another type that fixes them in parallel horizontally in the film forming furnace. The manner of fixing the plate-like workpieces by the workpiece fixture may be fixing the plate-like workpieces in touch at their outer portions with the workpiece fixture where they take a disk shape or may be fixing them in touch at their inner or/and outer portions with the workpiece fixture where they take a ring shape. FIG. 7 illustrates one example of fixing plate-like workpieces on a workpiece fixture horizontally in a film forming furnace. The plate-like workpieces of a ring shape are hung at a regular interval on a bar shape workpiece fixture extending horizontally.

The pressure of the processing gas is adjusted in a range of 13 to 1,330 Pa, more favorably in a range of 66.5 to 1,064 Pa, or much more favorably in a range of 266 to 798 Pa so that the sheath width is made to be in a range of 2 to 30 mm which is shorter than the interval between the plate-like workpieces.

Figure 13:
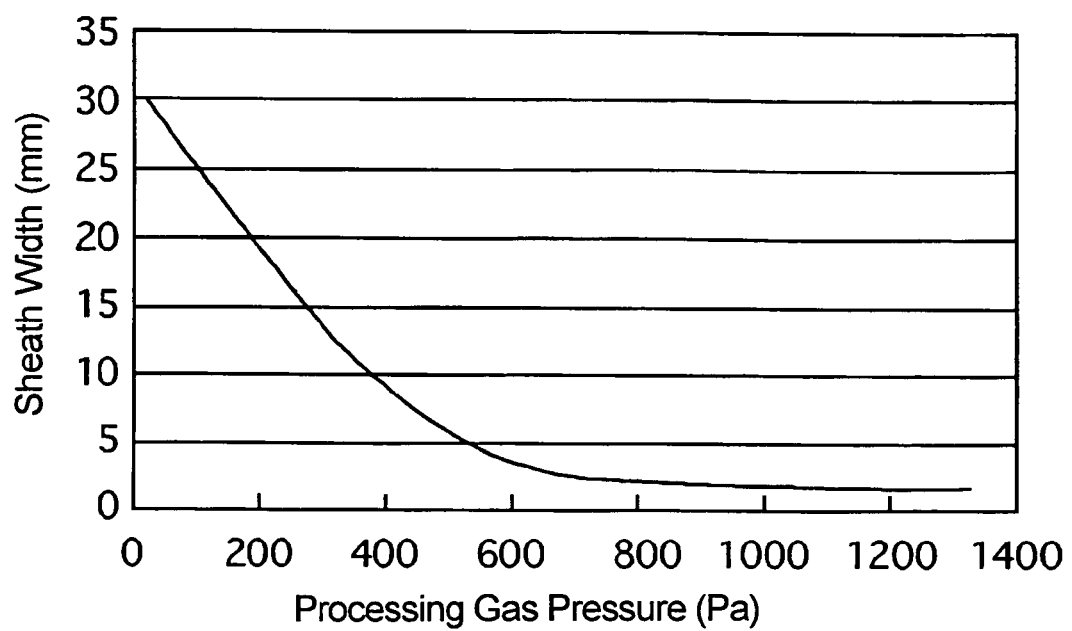
FIG. 13 is a graph showing the relation between the processing gas pressure and the sheath width in an amorphous carbon film forming method according to the present invention.

FIG. 13 is a graph showing the relation between the processing gas pressure and the sheath width in the amorphous carbon film forming method according to the present invention. In this case, as the processing gas, there is used a mixed gas consisting of $CH_4$, Ar, $H_2$ and TMS at the film forming temperature of 500° C. In the case of the processing gas pressure being less than 13 Pa, the sheath width is caused to be wider than 30 mm, and the interval of the plate-like workpieces has to be widen, so that the mass processing becomes unable to execute due to the decrease in number of the plate-like workpieces which can be fixed to the workpiece fixture at a time. On the other hand, the glow discharge is liable to become unstable in the case of the processing gas pressure being high, and the glow discharge becomes difficult to be kept even in the case of the gas pressure being equal to or higher than 1,330 Pa.

With the workpiece fixture and the plate-like workpieces as constructed above, when a voltage is applied from the plasma power supply, an electric discharge occurs along the plate-like workpieces. This causes the glow discharge to occur for each piece of the plate-like workpieces, whereby amorphous carbon films can be formed on the both surfaces of each plate-like workpiece.

The film forming furnace has a cylindrical furnace chamber, and plural workpiece fixtures are arranged at a regular angular interval on a circle coaxial with the furnace chamber. Plural tubular nozzles for supplying the processing gas are arranged at a regular angular interval on another circle which surrounds the workpiece fixtures outside in a coaxial relation with the furnace chamber. In this case, it is preferable that one or more nozzles vertically extending in parallel are additionally arranged at the center of the furnace chamber. The nozzles for supplying the processing gas may be arranged inside the workpiece fixtures in addition to being arranged to surround the workpiece fixtures.

[Forming Apparatus for Amorphous Carbon Films]

The forming apparatus for amorphous carbon films according to the present invention is an apparatus for forming amorphous films on surfaces of conductive plate-like workpieces by the plasma CVD method and is provided with a film forming furnace, workpiece fixtures for fixing the plate-like workpieces, nozzles for supplying a processing gas and a plasma power supply electrically connected to at least the workpiece fixtures.

The film forming furnace is not limited to any particular type as long as it is capable of being made vacuum and airtight. Preferably, the furnace is of the type having a cylindrical furnace chamber.

The material of the plate-like workpieces is not limited to any particular one as long as it has conductivity. The shape of the plate-like workpieces is also not limited to any particular shape. The workpieces are preferable to be a ring shape and may be clutch plates. Though not affecting on the sheath width, the thickness of the plate-like workpiece is in a range of 0.4 to 4 mm and more preferably, is in a range of 0.7 to 1 mm.

Each of the workpiece fixtures supports plural plate-like workpieces parallel in the vertical direction with the interval between facing surfaces of two adjoining plate-like workpieces being in a range of 2 to 30 mm. Where the interval between the plate-like workpieces is less than 2 mm, the sheaths come too close locally, and this causes the glow discharge to be unstable, thereby making it impossible to perform the film forming properly. Where the interval is equal to or more than 30 mm, on the contrary, there can be obtained a stable glow discharge, but the mass processing cannot be executed due to the decrease in number of the plate-like workpieces fixed by each workpiece fixture. The interval between facing surfaces of two plate-like workpieces is more preferably in a range of 3 to 20 mm and is much more preferably in a range of 5 to 15 mm. Regarding the manner of fixing the plate-like workpieces to each workpiece fixture, where the plate-like workpieces have a ring shape, there may be mentioned a manner of fixing the rings with inside or/and outside of the same being in touch with the workpiece fixture.

The workpiece fixtures are plural in number, which are arranged at a regular angular interval on a circle within the furnace chamber of the film forming furnace. All of the workpiece fixtures are connected to a negative electrode. Since the conductive plate-like workpieces are fixed on the workpiece fixtures with parts of the respective workpieces being in touch with the workpiece fixtures, the plate-like workpieces are also electrically connected to the negative electrode.

The nozzles for supplying the processing gas are composed of at least one nozzle arranged at the center of the workpiece fixtures which are arranged on the circle within the furnace chamber of the film forming furnace and plural nozzles arranged at the regular angular interval on the circle which surrounds the workpiece fixtures outside. The nozzle arranged at the center suffices to be one used in a conventional film forming apparatus and is not limited to any particular one. For example, the nozzle is preferable to be a ring gas nozzle having plural downward gas supply holes provided over the workpiece fixtures, to be a tubular nozzle shown in FIGS. 1 and 2, or to be one or more tubular nozzles provided for supplying gas in radial directions. Further, the nozzles arranged at the regular angular interval on the circle which is radially outside may be those used in the conventional film forming apparatus and, though not limited in particular, are preferable to be tubular nozzles each having plural holes at lateral faces thereof. In this case, it is preferable that a space in a range of 50 to 300 mm is provided between each plate-like workpiece and a nozzle therefor.

The plasma power supply suffices to be a plasma power supply used in the conventional plasma CVD method and is not limited in particular. The plasma power supply is connected to at least the workpiece fixtures to connect the same to the negative electrode.

Besides, if need be, there may be provided temperature measuring means such as thermocouple sensor, infrared temperature sensor or the like and film thickness measuring means.

Figure 2:
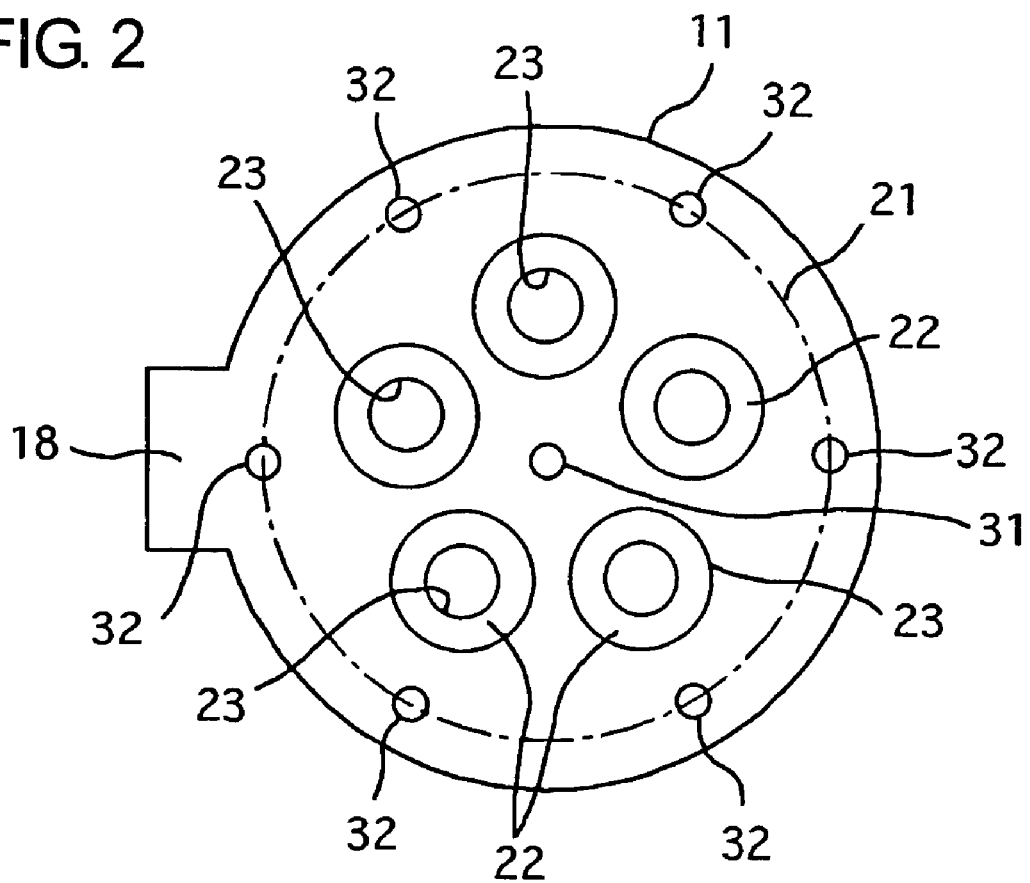
FIG. 2 is another explanatory view showing the schematic construction of the amorphous carbon film forming apparatus taken along the line X-X' in FIG. 1.

Hereafter, the embodiments according to the present invention will be described with reference to the drawings. FIG. 1 is an explanatory view showing the schematic construction of an amorphous carbon film forming apparatus, and FIG. 2 is a sectional view of the film forming apparatus taken along the line X-X' in FIG. 1.

Embodiment 1

The amorphous carbon film forming apparatus uses a cylindrical chamber 11 made of a stainless steel as a film forming furnace and has an exhaust system 13 communicating with the chamber 11 through an exhaust passage 12. The exhaust system 13 comprises a rotary oil pump, a mechanical booster pump and a diffusion oil pump and opens or closes an exhaust regulating valve 15 provided on the exhaust passage 12 to regulate the processing pressure within the chamber 11. Further, the chamber 11 is provided with a light pass window 18, through which an infrared temperature sensor (not shown) measures the surface temperature of the workpieces 22.

Within the chamber 11, there are arranged a cathode 20 electrically connected to the negative electrode of the plasma power supply 16 and gas supply means 30.

The cathode 20 is composed of a support table 21 electrically connected to the negative electrode of the plasma power supply 16, five workpiece fixtures 23 mounted on the support table 21 and plate-like workpieces 22 fixed on each of the workpiece fixtures 23.

The support table 21 of a disc shape is made of a carbon steel and is secured to the cathode 20 at the bottom of the cylindrical chamber 11 in co-axial relation with the same.

Each of the plate-like workpieces 22 is made of a carbon tool steel (SK5) and is 0.9 mm in thickness and 100 mm in diameter. The plate-like workpiece 22 takes a ring shape shown in FIG. 4 and has internal teeth 221 at its internal surface.

The five workpiece fixtures 23 are made of a carbon steel and are arranged on the support table 21 at a regular angular interval on a circle coaxial with the cylindrical chamber 11. The workpiece fixtures 23 are arranged at the regular angular interval on the circle of 40 cm (centimeters) in diameter with the center in alignment with the center of the chamber 11.

Figure 3:
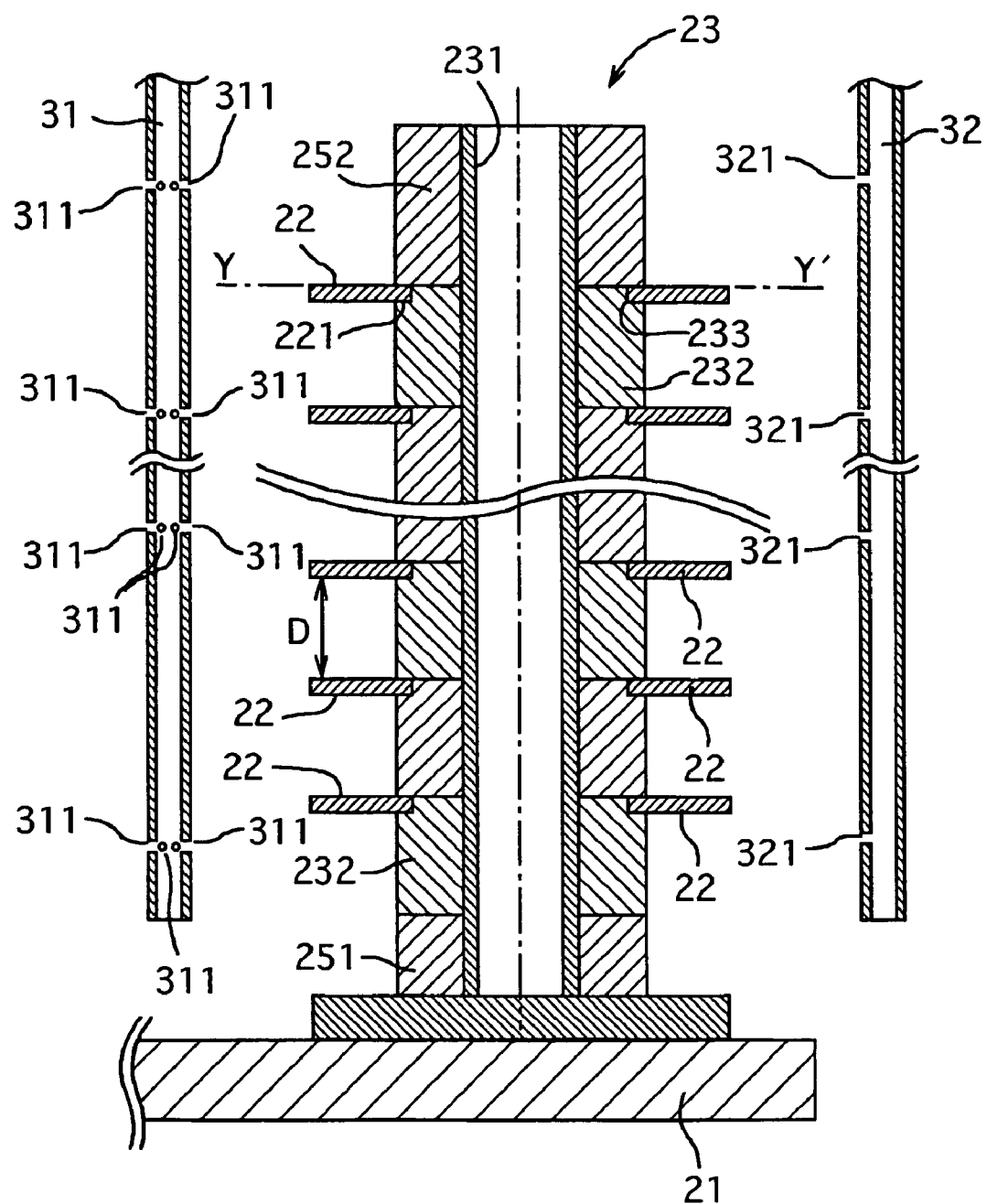
FIG. 3 is a sectional view showing a cathode and a gas supply means of the amorphous carbon film forming apparatus used in first to fourth embodiments and a first compared example.
Figure 4:
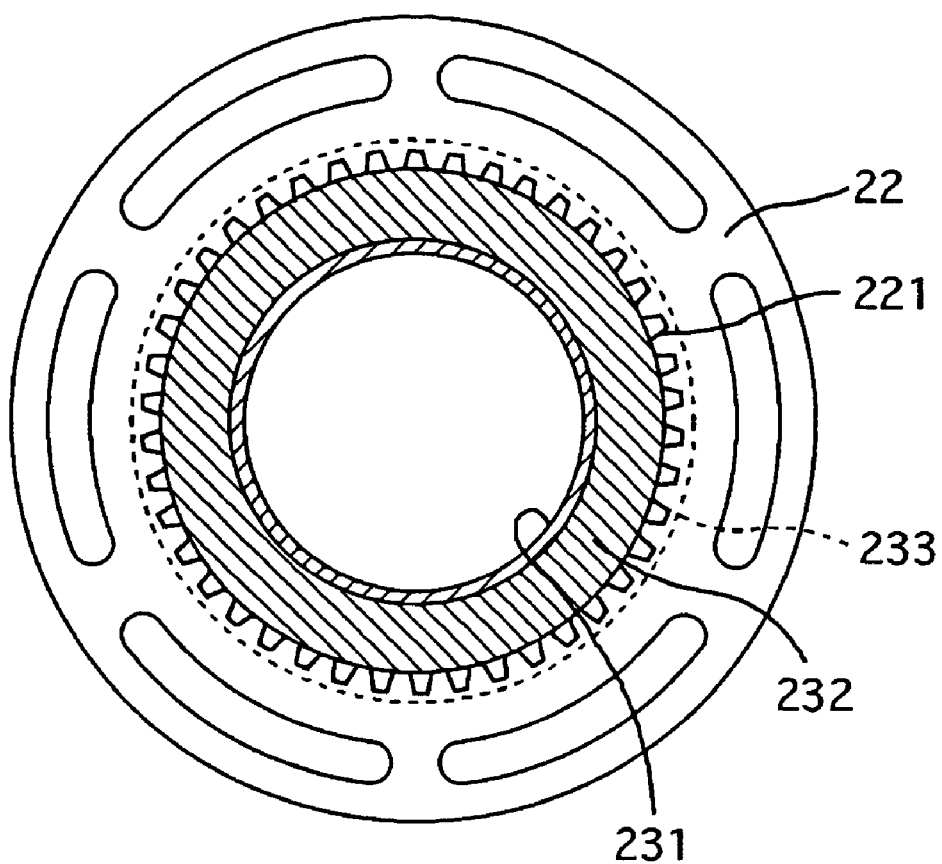
FIG. 4 is an enlarged view of a part, taken along the line Y-Y' in FIG. 3, of the amorphous carbon film forming apparatus used in the first to fourth embodiments and the first compared example.

Each workpiece fixture 23 is composed of a cylindrical fixed pillar 231 supported on the support table 21 to extend vertically and plural jigs 232 for fixing the plural plate-like workpieces 22 to be piled up in parallel at a regular interval (FIGS. 3 and 4). Each of the jigs 232 is cylindrical and has a stepped portion 233 at one end of its circumferential surface. The stepped portion 233 is right-angled in cross-section and has a step which is equal in depth to the thickness of the plate-like workpiece 22. The plate-like workpiece 22 is able to be coaxially fit at its internal teeth 221 on the stepped portion 233.

In order to fix the plate-like workpieces 22 on the workpiece fixture 23, a bottom member 251 is first fit on the fixed pillar 231 from the top of the same and is moved down along the fixed pillar 231 to be mounted on the support table 21. Then, in the same manner as is done for the bottom member 251, a jig 232 on which a plate-like workpiece 22 has been fixed in the aforementioned manner is placed on the bottom member 251. Then, by the repetition of the same handlings, the jigs 232 are in turn piled up until the number of the plate-like workpieces 22 becomes a predetermined number. After the number of the plate-like workpieces 22 reaches the predetermined number, a top member 252 is placed on the top portion.

The interval between the facing surfaces of two plate-like workpieces 22 adjoining in the vertical direction was set to 30 mm. The interval between the facing surfaces of two adjoining plate-like workpieces 22 is indicated at "D" in FIG. 3 and is hereafter referred to as "workpiece interval". That is, the workpiece interval is equal to a distance which is made by subtracting the height of the stepped portion 233 (i.e., the thickness of the plate-like workpiece) from the height of the jig 232. In this instance, one workpiece fixture 23 is capable of fixing thereon thirty-five (35) plate-like workpieces 22, so that the plate-like workpieces 22 of one hundred seventy-five (175) pieces in total can be fixed in the apparatus.

The gas supply means 30 supplies the chamber 11 with a mixed gas of a material gas and a dilution gas at a predetermined flow volume ratio. The mixed gas has its flow rate adjusted by a mass flow controller (MFC) 33 and then, is supplied inside the chamber 11 through a gas supply valve 34 and a gas supply conduit 35. The gas supply conduit 35 branches into a center gas nozzle 31 and six peripheral gas nozzles 32 inside the chamber 11. The gas nozzle 31 is placed to be positioned at the center portion of the chamber 11. And, the six gas nozzles 32 are arranged at a regular angular interval on a circle which surrounds the workpiece fixture 23 arranged on another circle. The gas nozzles 32 are arranged at respective positions distanced by thirty-five (35) cm from the center of the chamber 11. The gas nozzles 31 and 32 respectively have plural holes 311 and plural holes 321 opening at a regular interval in the longitudinal direction thereof. The holes 311 radially open toward the six gas nozzles 32.

A positive electrode of the plasma power supply 16 is electrically connected to the chamber 11. The positive electrode is grounded, so that the wall surface of the chamber 11 constitutes an earthing electrode (anode).

Amorphous carbon films were formed by operating the film forming apparatus for amorphous carbon films of the construction as described above. First of all, the chamber 11 was exhausted by the exhaust system 13 to a reached vacuum degree of $5 \times 10^{-3}$ Pa. Then, the gas supply valve 34 was opened, and the flow volumes of methane gas and TMS gas as the material gas and the flow volumes of hydrogen gas and argon gas as the dilution gas were adjusted by the MFC 33. Subsequently, the opening degree of the exhaust regulation valve 15 was adjusted to set the processing pressure within the chamber 11 to 133 Pa.

After a predetermined processing pressure was secured within the chamber 11 by charging the same with the dilution gas consisting of a predetermined flow volume ratio of hydrogen gas and argon gas, the plasma power supply 16 was operated to apply an electric power of 9.5 kW to the cathode 20. With voltage application, a glow discharge took place around the cathode 20, and the plate-like workpieces 22 were heated up to 500° C. through the glow discharge. Thereafter, methane gas and TMS gas as the material gas were supplied to a predetermined flow volume ratio, whereby an amorphous film grew up on the surface of each plate-like workpiece 22.

In the case of the apparatus in the present embodiment, the discharge was obtained stably with the sheath width of 25 mm. By the discharge for 30 minutes, the amorphous film of two (2) μm (micrometers) in thickness was obtained on the surface of each plate-like workpiece 22. The film thickness of the amorphous carbon film so obtained was even over the whole area.

Figure 8:
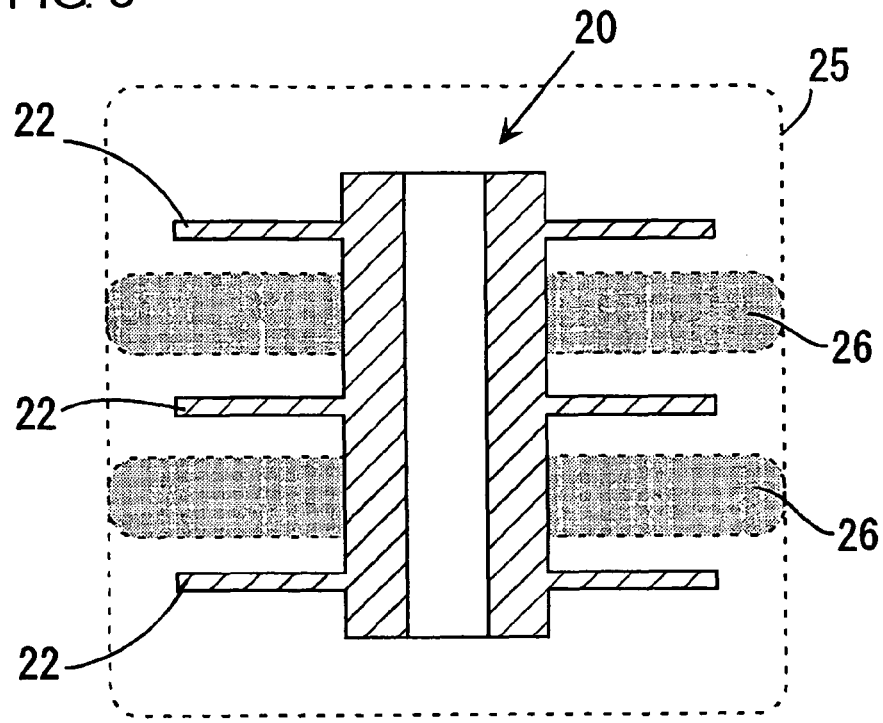
FIG. 8 is an illustration for explaining the state of a glow discharge in the first embodiment.

Table 1 noted below shows the film forming conditions for the amorphous carbon film. FIG. 8 shows the state of the glow discharge, and this figure is illustrated with only three pieces of the plate-like workpieces 22 for the purpose of explanation. The sheaths of a constant width were formed around the cathode 20. Since the sheaths 25 had their portions overlapped as indicated at 26, the sheath was formed along each of the plate-like workpieces 22.

TABLE 1

|  | Embodiment 1 | Embodiment 2 | Embodiment 3 | Embodiment 4 | Embodiment 5 | Compared Example 1 |
|---|---|---|---|---|---|---|
| Processing Gas Pressure [Pa] | 133 | 532 | 798 | 931 | 532 | 931 |
| Workpiece Interval [mm] | 30 | 10 | 3 | 2 | 10 | 1 |
| Sheath Width [mm] | 25 | 5 | 2 | 2 | 5 | (unstable) |

Embodiment 2

In the film forming apparatus in the first embodiment, the workpiece interval was altered to 10 mm (with the plate-like workpieces of 500 pieces in total). The gas pressure and the sheath width during the film forming were those values indicated in Table 1.

Figure 9:
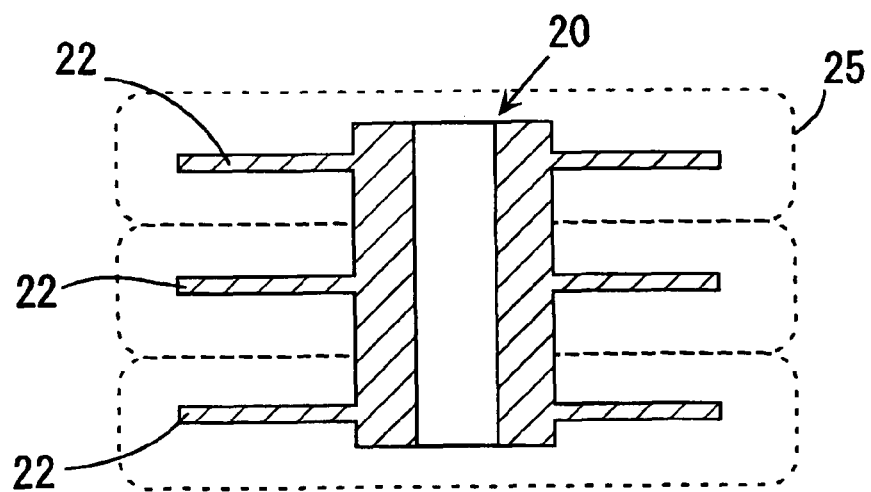
FIG. 9 is an illustration for explaining the state of the glow discharge in the second embodiment.

In the apparatus in the present embodiment, the discharge was kept stable, and the film thickness of the formed amorphous carbon film was even throughout the whole area. FIG. 9 shows the state of the glow discharge, and this figure is illustrated with only three pieces of the plate-like workpieces 22 for the purpose of explanation. The sheaths of a constant width were formed around the cathode 20.

Embodiment 3

In the film forming apparatus in the first embodiment, the workpiece interval was altered to 3 mm (with the plate-like workpieces of 600 pieces in total). The gas pressure and the sheath width during the film forming were those values indicated in Table 1.

Figure 10:
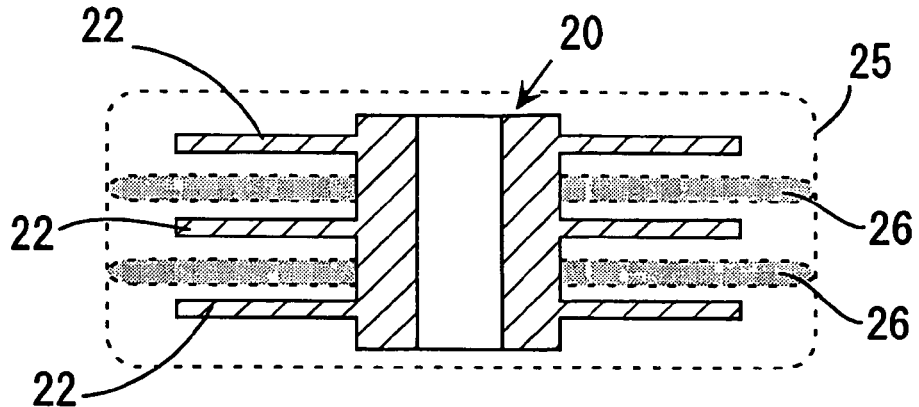
FIG. 10 is an illustration for explaining the state of the glow discharge in the third embodiment.

In the apparatus in the present embodiment, the discharge was kept stable, and the film thickness of the formed amorphous carbon film was even throughout the whole area. FIG. 10 shows the state of the glow discharge, and this figure is illustrated with only three pieces of the plate-like workpieces 22 for the purpose of explanation. The sheaths of a constant width were formed around the cathode 20. Although the sheaths 25 had their portions overlapped, the discharge was kept stable, and the sheath was formed along each of the plate-like workpieces 22.

Embodiment 4

In the film forming apparatus in the first embodiment, the workpiece interval was altered to 2 mm (with the plate-like workpieces of 750 pieces in total). The gas pressure and the sheath width during the film forming were those values indicated in Table 1. In the case of the workpiece interval being set to 2 mm, it is possible to fix the plate-like workpieces of 2,500 pieces at the maximum within the apparatus. However, since too many plate-like workpieces cause the plasma power supply to short, which makes it unable to form the sheaths for all the workpieces 22, the number of the plate-like workpieces 22 was determined to be 750 pieces in this particular instance.

Figure 11:
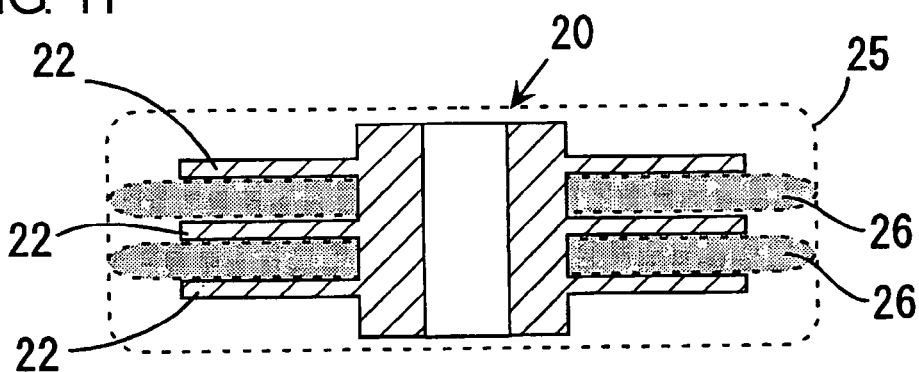
FIG. 11 is an illustration for explaining the state of the glow discharge in the fourth embodiment.

In the apparatus in the present embodiment, the discharge was kept stable, and the film thickness of the formed amorphous carbon film was even throughout the whole area. FIG. 11 shows the state of the glow discharge, and this figure is illustrated with only three pieces of the plate-like workpieces 22 for the purpose of explanation. The sheaths 25 of a constant width were formed around the cathode 20. Although the sheaths 25 had their portions overlapped as indicated at 26, the discharge was kept stable, and the sheath was formed along each of the plate-like workpieces 22.

Compared Example 1

In the film forming apparatus in the first embodiment, the workpiece interval was altered to 1 mm (with the plate-like workpieces of 500 pieces in total). The gas pressure and the sheath width during the film forming were those values indicated in Table 1.

Figure 12:
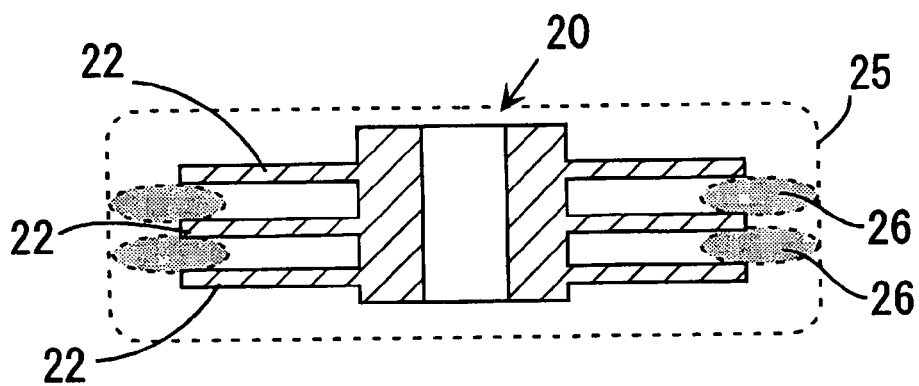
FIG. 12 is an illustration for explaining the state of the glow discharge in the first compared example.

In this example, the glow discharge became strong locally, whereby it was unable to keep the discharge even. FIG. 12 shows the state of the glow discharge, and this figure is illustrated with only three pieces of the plate-like workpieces 22 for the purpose of explanation. In this compared example, since the sheaths 25 were too close, the sheaths 25 had their portions locally overlapped to cause discharge only at the outer circumferential portions indicated at 26 of the plate-like workpieces 22, whereby the sheath was not formed along each of the plate-like workpieces 22.

Embodiment 5

In the film forming apparatus in the first embodiment, the plate-like workpieces 22 and the workpiece fixture 23 constituting the cathode 20 were changed to plate-like workpieces 42 and a workpiece fixture 43 (FIG. 5) which will be described hereafter.

In the present embodiment, the cathode 20 comprises the support table 21 connected to the negative electrode of the plasma power supply 16, five workpiece fixtures 43 mounted on the support table 21 and the plate-like workpieces 42 fixed on each of the workpiece fixtures 43.

Figure 6:
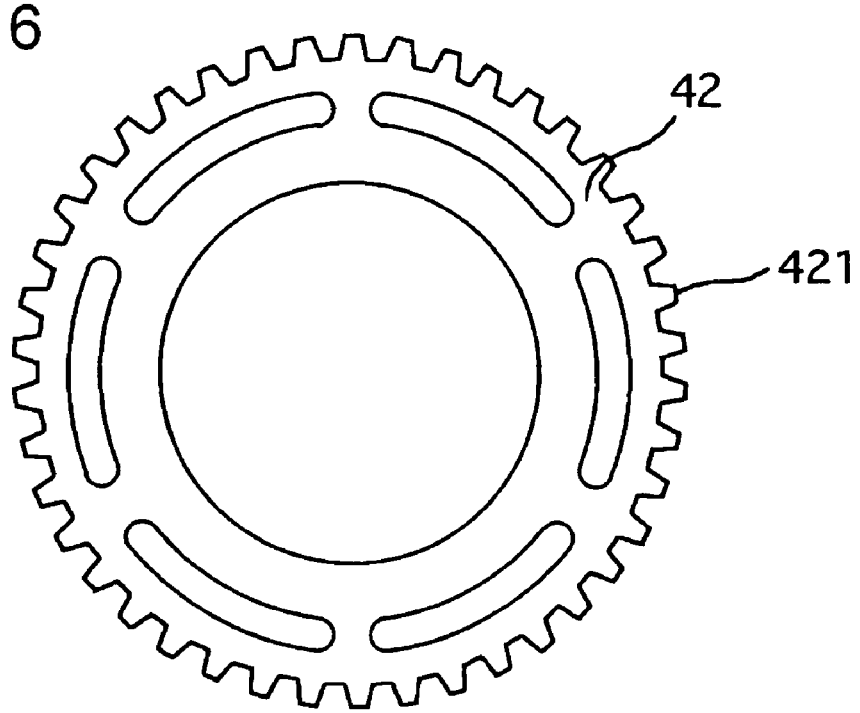
FIG. 6 is a view showing a plate-like workpiece for the amorphous carbon film forming apparatus in the fifth embodiment.

The plate-like workpieces 42 are made of a carbon tool steel (SK5) and are 0.9 mm in thickness and 100 mm in diameter. Each of the plate-like workpieces takes a ring shape shown in FIG. 6 and has an external teeth 421 formed at the circumferential surface thereof.

Figure 5:
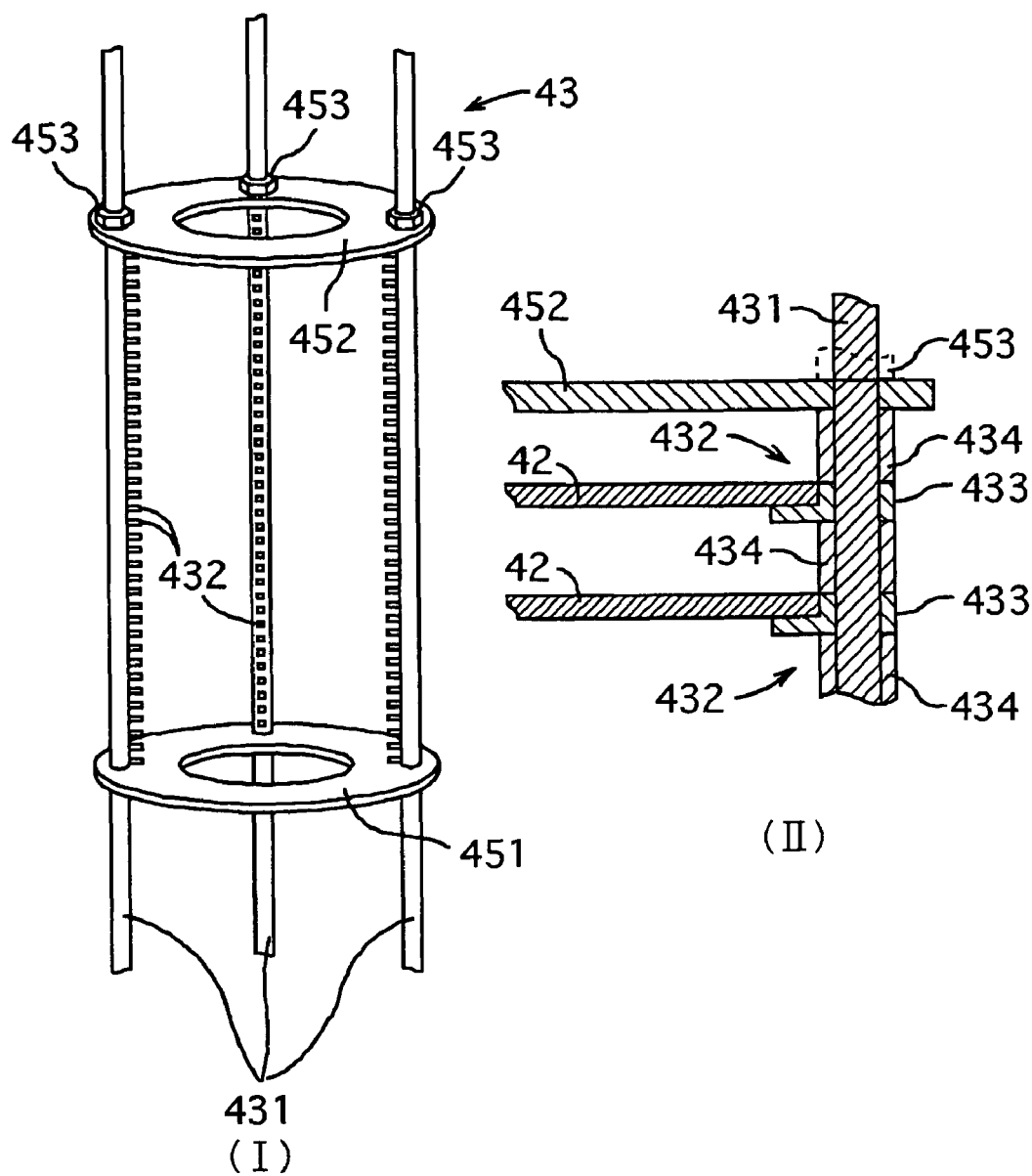
FIG. 5(II) is an enlarged fragmentary sectional view showing jigs for fixing workpieces thereon.

The five workpiece fixtures 43 are made of a carbon steel and are each composed of three support rods 431 and jigs 432, as shown in FIG. 5. Each jig 432 is provided with a receiving claw 433 being generally cylindrical and having a protrusion at the external surface thereof and a cylindrical spacer 434. FIG. 5 (I) does not show the plate-like workpieces for the explanation purpose, whereas FIG. 5(II) shows the jigs 432 with the plate-like workpieces being fixed thereon. The three support rods 431 fixed on the support table 21 at their one ends have nuts (not shown) screw-engaged therewith so that they are set to be the same height from the support table 21 as one another. A disc-like bottom plate 451 with three through holes arranged on a circle has the support rods 431 pass through the through holes and is carried by means of nuts 453 from the lower side, whereby the support rods 431 are fixed at a regular angular interval on a circle. The bottom plate 451 and a top plate 452 of the same shape as the bottom plate 451, as referred to later, constitute support means for the three support rods 431, so that the distance between two support rods 431 can be fixed.

In order to fix the plate-like workpieces 42 on each of the workpiece fixtures 43, first of all, spacers 434 are fit respectively on the three supports rods 431 and are moved down along the support rods 431. Next, in the same manner as is done for the spacers 434, the receiving claws 433 are placed on the spacers 434 so that the projections are oriented toward the axis of the bottom plate 451. Then, the external teeth 421 of a plate-like workpiece 42 is placed on the receiving claws 433. In this way, the plate-like workpiece 42 is mounted on the receiving claws 433 which are provided on the respective support rods 431 at the same height position and is fixed with the external teeth 421 being supported on the three receiving claws 433 from the lower side. Subsequently, the same handlings as above are repeated so that the jigs 432 are piled up until the number of the plate-like workpieces 42 reaches a desired number. After the number of the plate-like workpieces reaches the desired number, other spacers 434 are put, and then, the top plate 452 is put on the top portion. The top plate 452 is secured with nuts 453 from the upper side.

The interval between facing surfaces of two plate-like workpieces 42 adjoining in the vertical direction was set to 10 mm. In this instance, one workpiece fixture 43 was able to fix the plate-like workpieces 42 of one hundred (100) pieces thereon, so that the plate-like workpieces 42 of five hundreds (500) pieces in total were fixed in the apparatus.

By operating the film forming apparatus for amorphous carbon films of the foregoing construction, amorphous carbon films were formed in the same manner as is done in the first embodiment. According to the apparatus in the present embodiment, the sheath was formed along each of the plate-like workpieces 42. The sheath width was 5 mm, and the discharge was kept stable. The thickness of the formed amorphous carbon film was even throughout the whole area.

INDUSTRIAL APPLICABILITY

The amorphous carbon film forming method and apparatus according to the present invention can be wide used in forming amorphous carbon films as a functional material which has good mechanical properties such as wear resistance, solid lubricant and the like and which further has conductivity, visual ray/infrared ray transmittance, low permittivity, anti-oxygen barrier and the like.

The invention claimed is:

1. An amorphous carbon film forming method of forming amorphous carbon films on surfaces of conductive plate-like workpieces by a plasma CVD method, comprising the steps of:
arranging plural plate-like workpieces on a workpiece fixture, which provided in a film forming furnace to be connected to a negative electrode, in a state that the plate-like workpieces are stacked in parallel and adjoining workpieces have facing surfaces spaced from one another by an interval in the stacking direction of the plate-like workpieces;
providing plasma power to the film forming furnace to produce a plasma in the film forming furnace and a sheath formed around each of said plate-like workpieces, wherein the sheath of each of said plate-like workpieces has a sheath width comprising the width of the sheath in the stacking direction; and
controlling a processing gas pressure and a plasma power supply so that the sheath width becomes equal to or less than the interval between the facing surfaces of two adjoining plate-like workpieces.

2. The amorphous carbon film forming method as set forth in claim 1, wherein the processing gas pressure is in a range of 13 to 1,330 Pa, and wherein the interval between the facing surfaces of the two adjoining plate-like workpieces is in a range of 2 to 30 mm.

3. The amorphous carbon film forming method as set forth in claim 2, wherein the processing gas pressure is in a range of 66.5 to 1,064 Pa.

4. The amorphous carbon film forming method as set forth in claim 3, wherein the processing gas pressure is in a range of 266 to 798 Pa.

5. The amorphous carbon film forming method as set forth in claim 2, wherein the interval between the facing surfaces of the two adjoining plate-like workpieces is in a range of 3 to 20 mm.

6. The amorphous carbon film forming method as set forth in claim 5, wherein the interval between the facing surfaces of the two adjoining plate-like workpieces is in a range of 5 to 15 mm.

7. The amorphous carbon film forming method as set forth in claim 1, wherein the plate-like workpieces have a disc shape.

8. The amorphous carbon film forming method as set forth in claim 1, wherein the plate-like workpieces are clutch plates.

9. The amorphous carbon film forming method as set forth in claim 1, wherein the processing gas is a mixed gas consisting of one or more kinds selected from organometallic bearing gases and halogen compound including at least Si and also consisting of one or more kinds selected from hydrocarbon gases.

10. The amorphous carbon film forming method as set forth in claim 9, wherein the organometallic bearing gases are tetramethylsilane and silane.

11. The amorphous carbon film forming method as set forth in claim 9, wherein the halogen compound is silicon tetrachloride.

12. The amorphous carbon film forming method as set forth in claim 9, wherein the hydrocarbon gases are methane, ethylene, acetylene and benzene.

13. The amorphous carbon film forming method as set forth in claim 1, wherein the film forming furnace has a cylindrical furnace chamber, in which the workpiece fixtures are arranged at a regular angular interval on a circle having a center coaxial with the furnace chamber, in which plural tubular nozzles for supplying the processing gas are arranged at a regular angular interval on another circle which surrounds the workpiece fixtures with a center thereof coaxial with the furnace chamber, and in which at least one tubular nozzle is further arranged at the center of the furnace chamber to extend vertically in parallel to the plural tubular nozzles.

* * * * *